United States Patent [19]
Ilg et al.

[11] Patent Number: 5,963,837
[45] Date of Patent: Oct. 5, 1999

[54] METHOD OF PLANARIZING THE SEMICONDUCTOR STRUCTURE

[75] Inventors: Matthias Ilg; Dirk Tobben, both of Fishkill; Peter Weigand, Croton on Hudson, all of N.Y.

[73] Assignee: Siemens Aktiengesellschaft, Munich, Germany

[21] Appl. No.: 08/846,924

[22] Filed: Apr. 30, 1997

[51] Int. Cl.⁶ .................................................. H01L 21/02
[52] U.S. Cl. .................... 438/760; 438/762; 438/633; 438/763; 438/698; 438/699
[58] Field of Search .................... 438/760, 762, 438/763, 626, 631, 633, 634, 697, 698, 699

[56] References Cited

U.S. PATENT DOCUMENTS

| | | | |
|---|---|---|---|
| 5,204,288 | 4/1993 | Marks et al. | 438/699 |
| 5,268,333 | 12/1993 | Lee et al. | 438/698 |
| 5,312,512 | 5/1994 | Allman et al. | 156/636 |
| 5,449,314 | 9/1995 | Meikle et al. | 438/699 |
| 5,534,731 | 7/1996 | Cheung | 257/759 |

*Primary Examiner*—Chandra Chaudhari
*Assistant Examiner*—Thanh Nguyn
*Attorney, Agent, or Firm*—Stanton C. Braden

[57] ABSTRACT

A method for planarizing a semiconductor structure having a first surface region with a high aspect ratio topography and a second surface region with a low aspect ratio topography. A flowable material is deposited over the first and second surface regions of the structure. A portion of the material fills gaps in the high aspect ratio topography to form a substantially planar surface over the high aspect ratio topography. A doped layer, for example phosphorus doped glass, is formed over the flowable oxide material. The doped layer is disposed over the high aspect ratio and over the low aspect ratio regions. Upper surface portions over the low aspect ratio region are higher than an upper surface of the flowable material. The upper portion of the doped layer is removed over both the first and second surface portions to form a layer with a substantially planar surface above both the high aspect ratio region and the low aspect ratio region. The method is used for filling gaps, such as gaps between adjacent gate electrodes formed in a gate electrode surface region of a semiconductor structure.

14 Claims, 2 Drawing Sheets

METHOD OF PLANARIZING THE SEMICONDUCTOR STRUCTURE

BACKGROUND OF THE INVENTION

This invention relates generally to integrated circuits and manufacturing methods and more particularly to structures and methods having improved planarity and alkali ion gettering properties.

As is known in the art, in forming small line width geometries in a semiconductor process using photolithography, it is necessary to provide a highly planar surface for various photolithographic masks used in such process. Further, in the fabrication of dynamic random access memories (DRAMs), a plurality of gate electrodes are formed adjacent one another with relative small separation, i.e., gaps, between each adjacent pair thereof. The plurality of gate electrodes provide a high aspect ratio topography.

Further, the surface region adjacent the high aspect ratio topography may be relative low, i.e., relatively flat. Thus, it is necessary to fill these gaps width a suitable material, preferably a material with a low dielectric constant to prevent coupling between the adjacent electrodes and provide a planar surface over both the high and low aspect ratio topographies for subsequent photolithography.

With one process, after the gate electrodes are formed, a dielectric layer of silicon nitride is chemically vapor deposited (CVD) over the surface. The CVD silicon nitride is a conformal deposition and therefore gaps remain between adjacent gate electrode structures. The gap width between gate electrode structures after the layer of silicon nitride is deposited is in the order of 1200 Å. Next, a layer of borophosphorosilicate glass (BPSG) is chemically vapor deposited over the structure to fill in the gaps. The CVD BPSG is thick enough to not only fill the gaps but also extends over the tops of the CVD silicon nitride layer and over the filled gaps to a thickness in the order of 1000 Å.

As is also known in the art, contaminants, such as sodium ions, or other alkali ions may come into contact with the outer BPSG layer. However, the phosphorous in the BPSG layer acts as a gettering material to counteract the effect of the alkali ion contaminant. The structure is then heated to form a more planar surface. However, with aspect ratios of 3–5 or higher, the BPSG layer may not provide a surface with the requisite degree of planarity.

SUMMARY OF THE INVENTION

In accordance with the invention, planarizing a semiconductor structure having a first surface region with a high aspect ratio topography and a second surface region with a low aspect ratio topography is provided. A material is deposited over the first and second surface regions of a substrate. A portion of material fills gaps in the high aspect ratio topography to form a substantially planar surface over the high aspect ratio topography, the levels of the high and low aspect ratio topographies over the surface of the substrate being different. A doped layer, for example phosphorus doped glass, is formed over the deposited material. The doped layer is disposed over the high aspect ratio and over the low aspect ratio regions. Upper surface portions of the doped layer over the low aspect ratio region are higher than an upper surface of the deposited material. The upper surface portions of the doped layer are removed over both the first and second surface portions to form a doped layer with a substantially planar surface above both the high and low aspect ratio topographies.

In accordance with another feature of the invention, a method for filling gaps between adjacent gate electrodes formed in a gate electrode surface region of a semiconductor structure is provided. The method includes the step of spinning on a material over the structure. A first portion of such material flows between the gate electrodes to fill the gaps and a second portion of such material becomes deposited over tops of the gate electrodes and over the gaps to form a layer with a substantially planar surface over the gate electrodes. A doped layer, for example phosphorus doped glass, is formed over the self-planarizing material. An upper portion of the doped layer is removed to form a layer with a substantially planar surface above the region of the gate electrode surface region of the semiconductor structure.

The invention provides a substantially planar layer over the semiconductor structure for subsequent photolithography and the phosphorous dopant provides gettering to remove adverse effects of alkali contaminant ions which may enter the doped layer. Still further, the dielectric constant of the material filling the gaps, i.e., the first portion of the gap filling material, being substantially free of such contaminants and dopant, has a relatively low dielectric constant thereby reducing electrical coupling between adjacent electrodes.

In accordance with one feature of the invention, the spin-deposited material is a flowable material, such as hydrogensilsesquioxane glass. The phosphorous doped layer may be provided by chemical vapor deposition, for example.

BRIEF DESCRIPTION OF THE DRAWING

Other features of the invention, as well as the invention itself, may be more fully understood with reference to the following detailed description taken together with the accompanying drawings, in which:

FIG. 1 showing a plurality of gate electrodes disposed over a high aspect ratio topography surface region of a semiconductor substrate such region adjacent a low aspect ratio topography surface region; FIG. 2 showing the structure of FIG. 1 after such structure having spun over it a self-planarizing material, a first portion of such material flowing between the gate electrodes to fill the gaps and a second portion of such material becoming deposited over tops of the gate electrodes and over the gaps to form a layer with a substantially planar surface; FIG. 3 showing the structure after a doped layer is deposited over the self-planarizing material; and FIG. 4 showing a the structure after the doped layer is planarized over both the high and low aspect ratio topographies.

DETAILED DESCRIPTION

Figure 1:
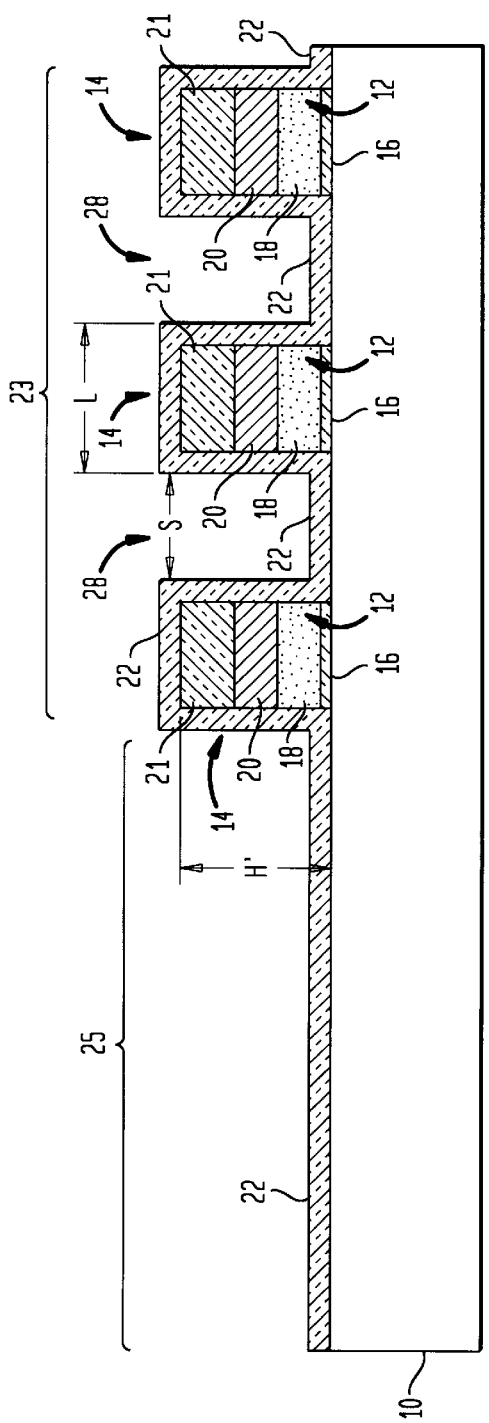
FIGS. 1–4 are diagrammatical, cross sectional sketches of a semiconductor integrated circuit structure fabricated in accordance with the invention.

Referring now to FIG. 1, a semiconductor substrate 10, here a silicon wafer, is provided. As shown, a plurality of MOS transistors 12 has been formed on the upper surface thereof. Each one of the transistors 12 has source and drain regions, not shown, with a corresponding one of a plurality of gate electrodes 14 disposed between each of the source and drain regions. Here, each gate electrode 14 includes a bottom layer 16 of thermally grown silicon dioxide, a layer 18 of doped, low pressure chemical vapor deposited (LPCVD) polycrystalline silicon formed on the silicon dioxide layer 16, a layer 20 of chemically vapor deposited tungsten-silicide formed on the polycrystalline silicon layer 18 and a top layer 21 of silicon nitride. The height H' of the gate stack (i.e., layers 16, 18, 20, and 21) is here about 4000 Å. After forming the gate stack, a silicon nitride liner 22 is chemically vapor deposited over surface of the structure. Here, the silicon nitride liner 22 has a thickness of about 300 Å. Further, here the length (L) of the gate electrodes 14 (i.e., the across the outer sidewalls of the silicon nitride liner 22) is in the order of 1800 Å and the space (S) or gaps 28 between adjacent gate electrodes 14 (i.e., the distance between the outer sidewall of the adjacent silicon nitride liners 22) is in the order of about 1200 Å. It is noted that the surface of the structure shown in FIG. 1 has a high aspect ratio region 23 where the gate electrodes 14 are formed and a low aspect ratio region 25. The aspect ratio is the ratio of the height of the topography to the width of the topography. The aspect ratio (A) is the ratio of H' to S (i.e., A=H'/S). Here, in the high aspect ratio region 23, A is in the range from about 3.3 to 4.1 or higher. It is noted that in the low aspect ratio region 25, A is substantially zero.

Figure 2:
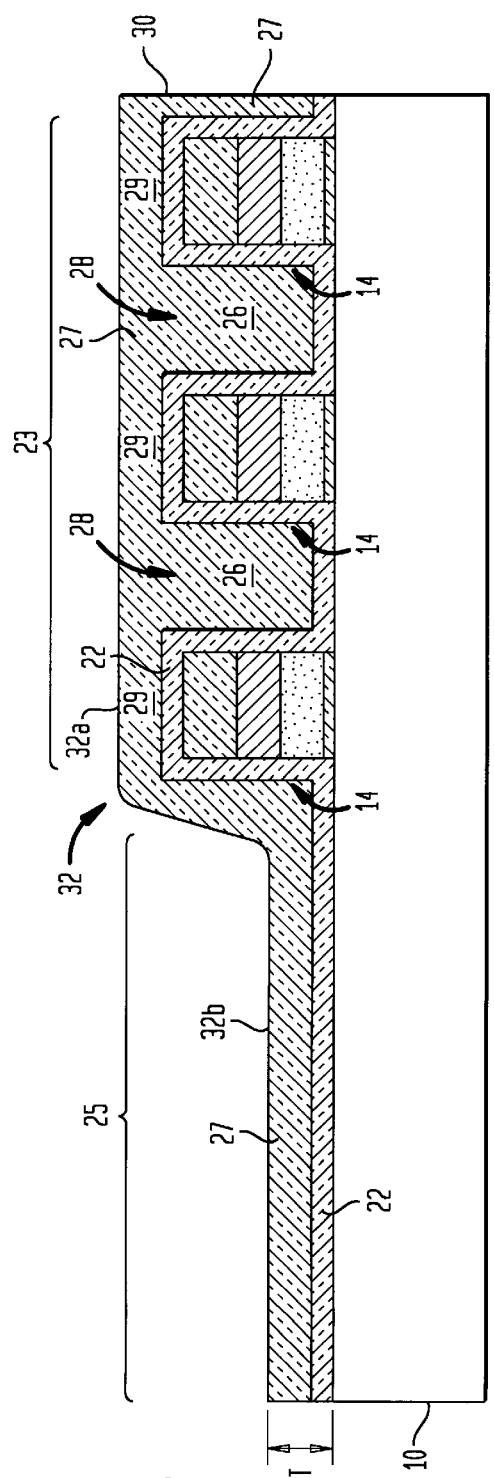

After patterning the gate electrodes 14 using conventional photolithographic etching techniques, a self-planarizing material 27 is spun over the surface of the structure, as shown in FIG. 2. The material 27 is a flowable material. In one embodiment, the flowable material is an oxide such as hydrogensilsesquioxane glass manufactured and sold by Dow-Corning, Midland, Mich. When such flowable oxide material 27 is spun on the wafer, it is self-planarizing and a first, lower portion 26 of the material 24 flows between the gate electrodes 14 to fill the gaps 28 between adjacent gate electrodes 14 and a second, upper portion 29 of the material 24 becomes deposited over tops of the gate electrodes 14 and the filled gaps 28 between adjacent gate electrodes 14 to form a layer 30 with a substantially planar surface portion 32a over the aspect ratio region 23 and substantially planar surface 32b over the low 32b aspect ratio region 25; it being noted that there is a non-planar transition region 32 between regions 32a, 32b. That is, the surface portions 32a, 32b are at different heights above the surface of the substrate 10.

The self-leveling material 26 is deposited in a thickness to sufficiently provide isolation between the gate stacks and conductive layer (not shown) above the self-leveling material. In one embodiment, the thickness (T) of the self-leveling material over the low aspect ratio region 25 is in the order of about 3000 Å. The thickness of the material 26 in region 29 is about 1000 Å and about 5000 Å in the region 26. After spin-depositing the material 24, the structure is baked on a hot plate and cured in an oven at about 400° C. for about one hour in a nitrogen atmosphere to harden the material.

Figures 3, 4:
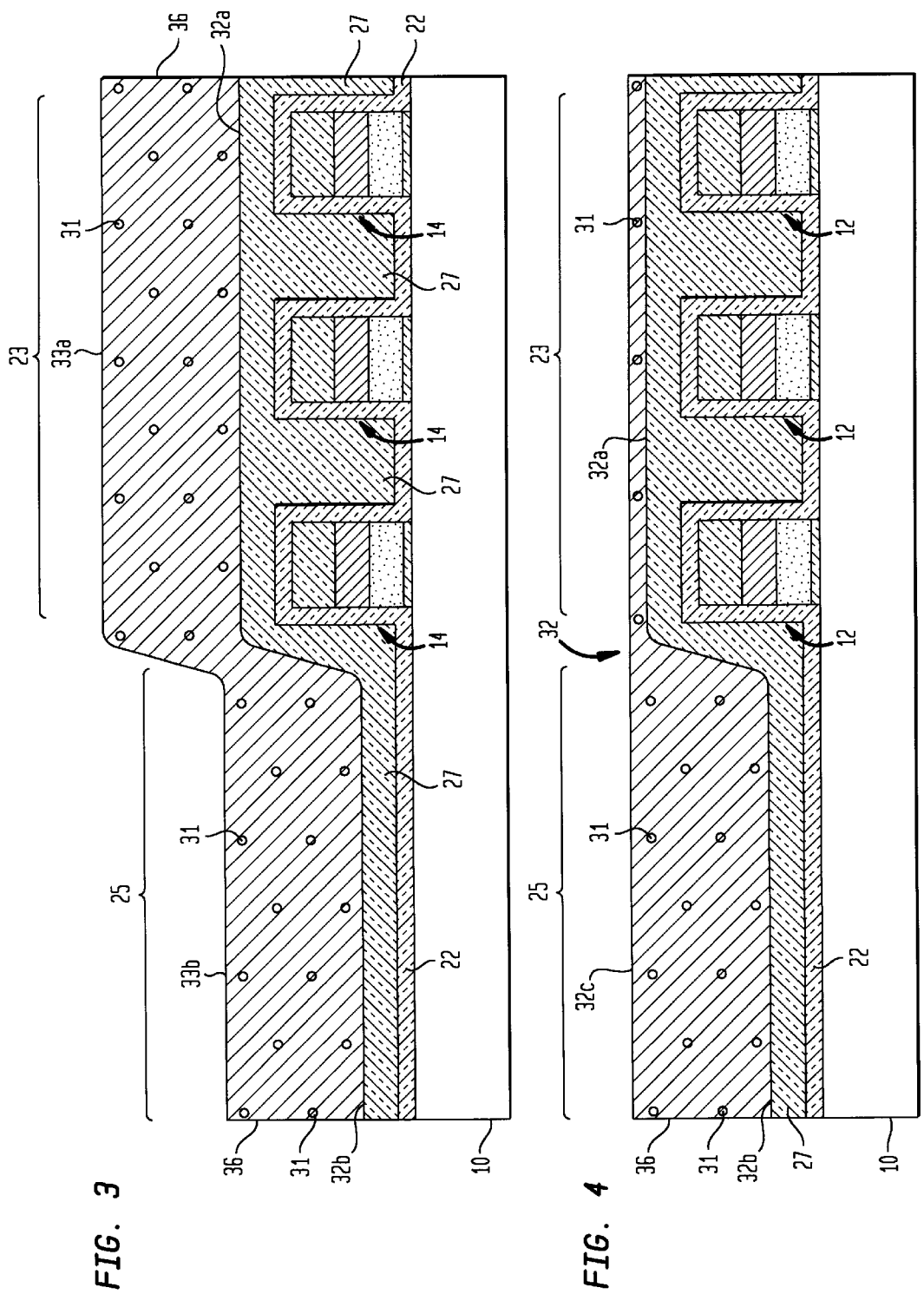

Referring to FIG. 3, a layer 36 is provided over the upper surface of the cured material 24. The layer is doped with an alkali ion gettering dopant 31, such as phosphorous. The dopant concentration of phosphorous in the layer is sufficient to getter contaminants. The dopant concentration, in one embodiment, is about 2–6 weight %, preferably about 2–5 weight %, and more preferably about 2–4 weight %. The doped layer, for example, is phosphorous doped silicate glass (PSG) formed by chemical vapor deposition (CVD). The formation of PSG by CVD results in a conformal layer, causing the height of the surface portion 33a of layer 36 over the high aspect ratio region 23 to be greater than the height of surface portion 33b of layer 36 over the low aspect ratio region 25. It is also noted that height of the surface portion 32b of layer 36 is greater than the height of the surface portion 32a of the material 27. That is, upper surface portion 33b of the doped layer 36 over the low aspect ratio region 25 are higher than the upper surface portions 32a, 32b of the flowable oxide material 27. The layer 36 is sufficiently thick such that the upper surface portion 33b is higher than the upper surface portion 32a. As shown, the doped layer 36 is deposited to a thickness of about 4000 Å.

Referring now to FIG. 4, portions of the upper surfaces 33a, 33b (FIG. 3) of the doped layer are removed by, for example, chemical mechanical polishing (CMP). The CMP produces a doped layer 36 with a substantially planar surface 33c above both the high and low aspect ratio topographies and over the non-planar transition region 32. The doped layer above the high aspect ratio topographies is sufficiently thick to effectively getter contaminants. In one embodiment, the thickness of the doped layer in the high aspect ratio topographies is about 1000 Å.

Thus, with the methods described above, a structure shown in FIG. 4 is highly planar as required for subsequent photolithographic processing, for example in forming upper metalization layers or electrically conductive interconnecting wires (not shown). Further, the phosphorous dopant provides gettering to remove adverse effects of alkali ion contaminant ions. Still further, the dielectric constant of the material filing the gaps 28, being substantially free of such contaminants, has a relatively low dielectric constant (i.e., in the order of 3.0 to 3.8) thereby reducing electrical coupling between adjacent gate electrodes.

Other embodiments are within the spirit and scope of the appended claims. For example, other flowable materials may be spun-on the structure shown in FIG. 1, such as spun-on silica aerogel or other inorganic spun on materials. Still further, the flowable material may be formed using a gaseous deposition process with similar flow properties as that obtained with the spun on glass material described above instead of using such spin deposited process. One such material which may be used with gaseous deposition is Flowfill material sold by PMT-Electrotech, Chatsworth, Calif. Still further, the process may be used to fill gaps other then gaps between adjacent gate electrodes, such as gaps between metal lines used as electrical interconnects over the structure.

What is claimed is:

1. A method for planarizing a semiconductor structure having a first surface region of a substrate with a high aspect ratio topography and a second surface region of the substrate with a low aspect ratio topography, such method comprising the steps of:

depositing a flowable material over the first and second surface regions of the substrate, such material being characterized in that after deposition the material has a substantially planar surface, a portion of the material filling gaps in the high aspect ratio topography of the first surface region and forming a substantially planar surface over the high aspect ratio topography first surface region and a substantially planar surface over the low aspect ratio second surface region, the planar surface over the first surface region being at a different level over the substrate than the planar surface over the second surface region; and forming a doped layer over the deposited flowable material, the doped layer being formed over the high aspect ratio and over the low aspect ratio first and second surface regions, upper surface portions of the doped layer over the low aspect ratio second surface region being higher than upper surface portions of the deposited flowable material over the high aspect ratio first surface regions; and removing upper surface portions of the doped layer over both the first and second surface portions to form the doped layer with a substantially planar surface, such planar surface of the doped layer extending above both the first and second surface regions.

2. The method recited in claim 1 wherein the step of forming the doped layer comprises the step of chemical vapor depositing phosphorus doped glass.

3. The method recited in claim 1 wherein the step of depositing the flowable material comprises the step of spin depositing such flowable material.

4. The method recited in claim 1 wherein the step of depositing the flowable material comprises the step of using gaseous deposition.

5. The method recited in claims 1, 2 or 3 wherein the step of depositing the flowable material comprises the step of depositing a flowable oxide.

6. The method recited in claim 3 wherein the spin depositing step comprises the step of spin depositing hydrogensilsesquioxane glass.

7. The method recited in claims 1, 2 or 3 wherein the step of depositing the flowable material comprises the step of depositing a flowable inorganic material.

8. A method for planarizing a semiconductor structure having a first surface region of a substrate with a high aspect ratio topography and a second surface region of the substrate with a low aspect ratio topography, such method comprising the steps of:

depositing a flowable material over the first and second surface regions of the substrate, such material being characterized in that after deposition the material has a substantially planar surface, a portion of such material filling gaps in the high aspect ratio topography of the first surface region forming a substantially planar surface over the high aspect ratio topography first surface region and a substantially planar surface over the low aspect ratio second surface region, the planar surface over the first surface region being at a different level over the substrate than the planar surface over the second surface region; and curing the flowable material;

forming a doped layer over the cured flowable material, the doped layer being formed over the high aspect ratio and over the low aspect ratio first and second surface regions, upper surface portions of the doped layer over the low aspect ratio second surface region being higher than upper surface portions of the deposited flowable material over the high aspect ratio first surface regions; and removing upper surface portions of the doped layer over both the first and second surface portions to form the doped layer with a substantially planar surface, such planar surface of the doped layer extending above both the first and second surface regions.

9. The method recited in claim 8 wherein the step of forming the doped layer comprises the step of chemical vapor depositing phosphorus doped glass.

10. The method recited in claim 8 wherein the step of depositing the flowable material comprises the step of spin depositing such flowable material.

11. The method recited in claim 8 wherein the step of depositing the flowable material comprises the step of using gaseous deposition.

12. The method recited in claims 8, 9 or 10 wherein the step of depositing the flowable material comprises the step of depositing a flowable oxide.

13. The method recited in claim 10 wherein the spin depositing step comprises the step of spin depositing hydrogensilsesquioxane glass.

14. The method recited in claims 8, 9 or 10 wherein the step of depositing the flowable material comprises the step of depositing a flowable inorganic material.

* * * * *